United States Patent
Cho et al.

(10) Patent No.: US 11,735,530 B2
(45) Date of Patent: Aug. 22, 2023

(54) SEMICONDUCTOR DEVICE AND METHOD OF INTEGRATING RF ANTENNA INTERPOSER WITH SEMICONDUCTOR PACKAGE

(71) Applicant: STATS ChipPAC Pte. Ltd., Singapore (SG)

(72) Inventors: NamJu Cho, Gyeonggi-do (KR); YoungCheol Kim, Gyeonggi-do (KR); HaengCheol Choi, Gyeonggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 104 days.

(21) Appl. No.: 17/445,908

(22) Filed: Aug. 25, 2021

(65) Prior Publication Data
US 2023/0067475 A1    Mar. 2, 2023

(51) Int. Cl.
| | |
|---|---|
| H01L 25/18 | (2023.01) |
| H01L 23/538 | (2006.01) |
| H01L 25/00 | (2006.01) |
| H01Q 1/22 | (2006.01) |

(52) U.S. Cl.
CPC .......... *H01L 23/5386* (2013.01); *H01L 25/18* (2013.01); *H01L 25/50* (2013.01); *H01Q 1/2283* (2013.01)

(58) Field of Classification Search
None
See application file for complete search history.

(56) References Cited

U.S. PATENT DOCUMENTS

| | | | |
|---|---|---|---|
| 6,770,955 B1 * | 8/2004 | Coccioli | H01L 23/3128 257/784 |
| 7,989,707 B2 | 8/2011 | Yamano et al. | |
| 8,076,765 B2 | 12/2011 | Chen et al. | |
| 9,171,792 B2 | 10/2015 | Sun et al. | |
| 11,037,898 B2 | 6/2021 | Chu et al. | |
| 2018/0197829 A1* | 7/2018 | Stiebler | H01L 23/49827 |
| 2019/0355680 A1* | 11/2019 | Chuang | H01L 23/5389 |
| 2020/0161252 A1* | 5/2020 | Yang | H01L 23/552 |

FOREIGN PATENT DOCUMENTS

| | | | | |
|---|---|---|---|---|
| CN | 101286500 B | * | 8/2011 | ........... H01Q 1/2283 |
| EP | 1952312 B1 | * | 2/2012 | ....... G06K 19/07745 |

* cited by examiner

*Primary Examiner* — Michael Lebentritt
(74) *Attorney, Agent, or Firm* — Robert D. Atkins; Patent Law Group: Atkins and Associates, P.C.

(57) ABSTRACT

A semiconductor device has a substrate and a first electrical component disposed over a first surface of the substrate. An RF antenna interposer is disposed over the substrate with the first electrical component connected to a first antenna disposed on a surface of the antenna interposer. An area of the antenna interposer is substantially the same as an area of the substrate. The first antenna disposed on the surface of the antenna interposer has a plurality of islands of conductive material. Alternatively, the first antenna disposed on the surface of the antenna interposer has a spiral shape of conductive material. A second antenna can be disposed on the surface of the antenna interposer connected to a second electrical component disposed over the substrate. A second electrical component can be disposed over a second surface of the substrate opposite the first surface of the substrate.

21 Claims, 12 Drawing Sheets

SEMICONDUCTOR DEVICE AND METHOD OF INTEGRATING RF ANTENNA INTERPOSER WITH SEMICONDUCTOR PACKAGE

FIELD OF THE INVENTION

The present invention relates in general to semiconductor devices and, more particularly, to a semiconductor device and method of integrating an RF antenna interposer with a semiconductor package.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications such as radio frequency (RF) wireless communications, often contain one or more integrated passive devices (IPDs) to perform necessary electrical functions, such as RF signal processing. The semiconductor devices must be connected to an RF antenna to transmit and receive the RF signals. The RF antenna can be located external to the semiconductor device, e.g., on a PCB. Alternatively, the RF antenna can be integrated in the semiconductor package. The integrated RF antenna is typically embedded with the semiconductor package and/or occupies a relatively small area of the package. The integrated RF antennas known in the prior art lack in RF transmission and reception performance and quality.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
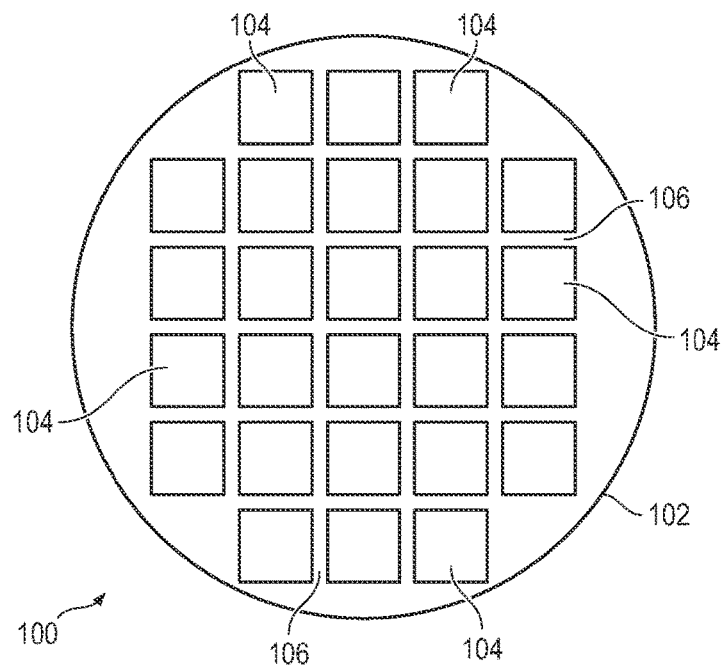
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
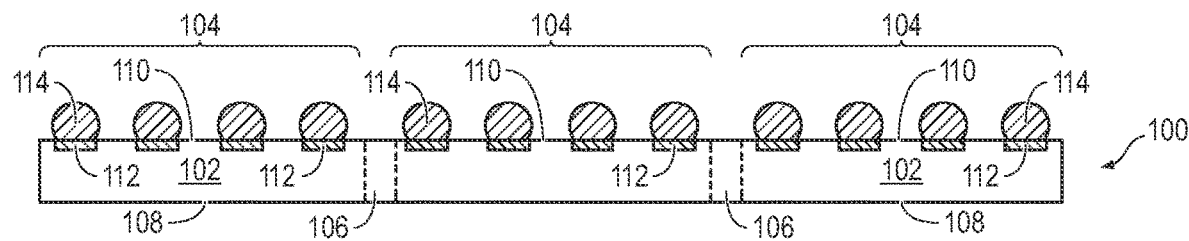

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, and other circuits for RF signal processing. Surface 108 can undergo backgrinding to planarize semiconductor die 104.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
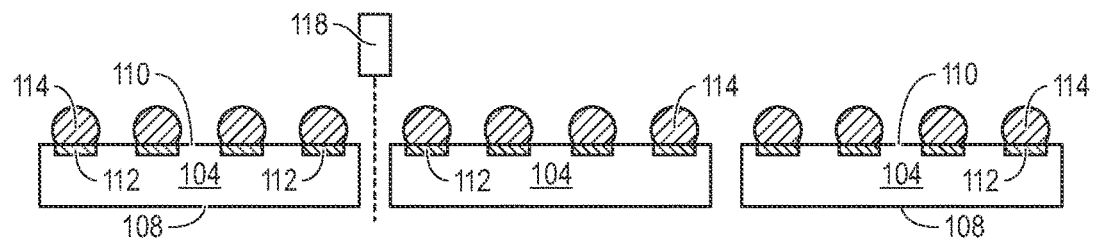

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post singulation.

Figure 2A:
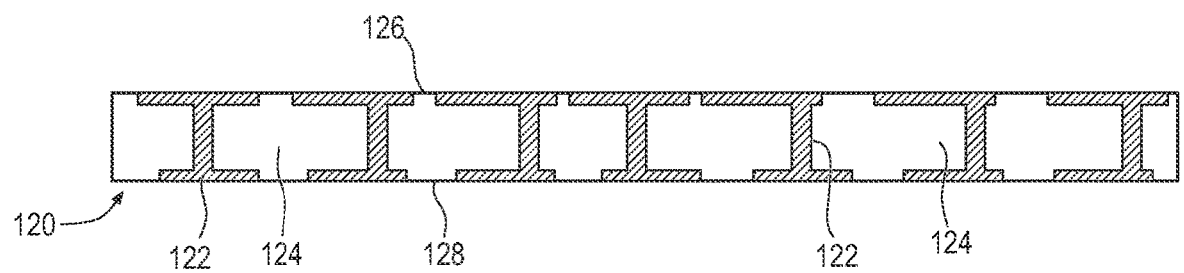
FIGS. 2a-2f illustrate a process of forming a semiconductor package with semiconductor die and interconnect substrate.

FIGS. 2a-2f illustrate a process of forming a semiconductor package with semiconductor die and interconnect substrate. FIG. 2a shows a cross-sectional view of interconnect substrate or PCB 120 including conductive layers 122 and insulating layer 124. Conductive layer 122 can be one or more layers of Al, Cu, Sn, Ni, Au, Ag, or other suitable electrically conductive material. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of the electrical components.

Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polymer, polyimide, benzocyclobutene (BCB), polybenzoxazoles (PBO), and other material having similar insulating and structural properties. Insulating layer 124 provides isolation between conductive layers 122.

Figure 2B:
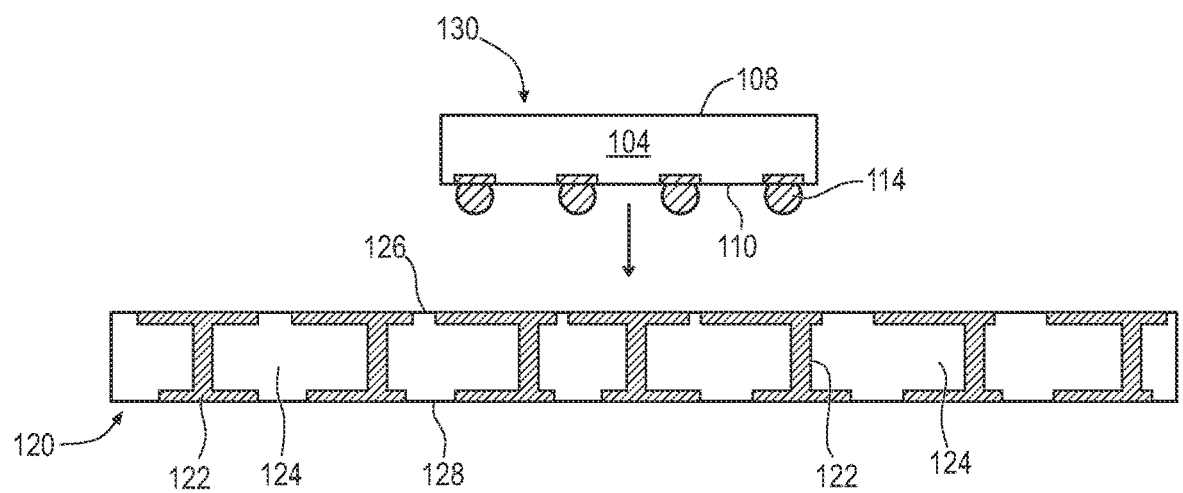
Figure 2C:
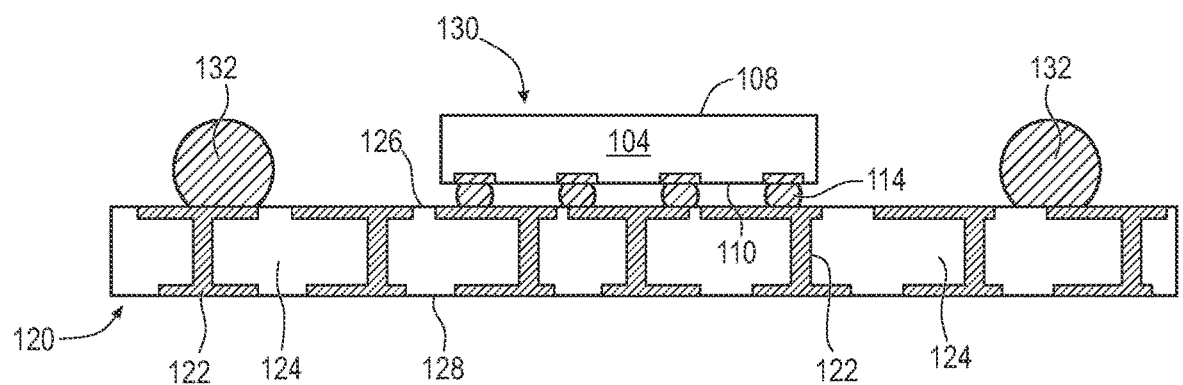

In FIG. 2b, electrical component 130 is positioned over substrate 120 using a pick and place operation. For example, electrical component 130 can be semiconductor die 104 from FIG. 1c with active surface 110 and bumps 114 oriented toward surface 126 of substrate 120 and electrically connected to conductive layer 122. In one embodiment, electrical component 130 is an RF signal processing component. Additional electrical components, such as other semiconductor die, semiconductor package, surface mount device, discrete electrical device, discrete transistor, diode, or IPD, can be mounted to interconnect substrate 120. FIG. 2c shows electrical component 130 mounted to interconnect substrate 120 with bumps 114 making mechanical and electrical connection to conductive layer 122.

An electrically conductive bump material is deposited over conductive layer 122 on surface 126 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 132. In one embodiment, bump 132 is formed over a UBM having a wetting layer, barrier layer, and adhesive layer. Bump 132 can also be compression bonded or thermocompression bonded to conductive layer 122. Bump 132 represents one type of interconnect structure that can be formed over conductive layer 122. The interconnect structure can also use bond wires, conductive paste, stud bump, micro bump, or other electrical interconnect.

Figure 2D:
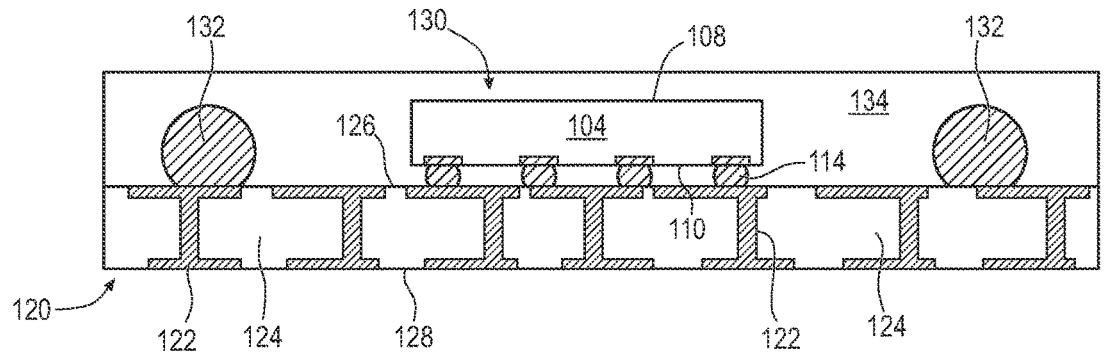

In FIG. 2d, an encapsulant or molding compound 134 is deposited over electrical component 130, bumps 132, and surface 126 of interconnect substrate 120 using a paste printing, compressive molding, transfer molding, liquid encapsulant molding, vacuum lamination, spin coating, or other suitable applicator. Encapsulant 134 can be polymer composite material, such as epoxy resin with filler, epoxy acrylate with filler, or polymer with proper filler. Encapsulant 134 is non-conductive, provides structural support, and environmentally protects the semiconductor device from external elements and contaminants.

Figure 2E:
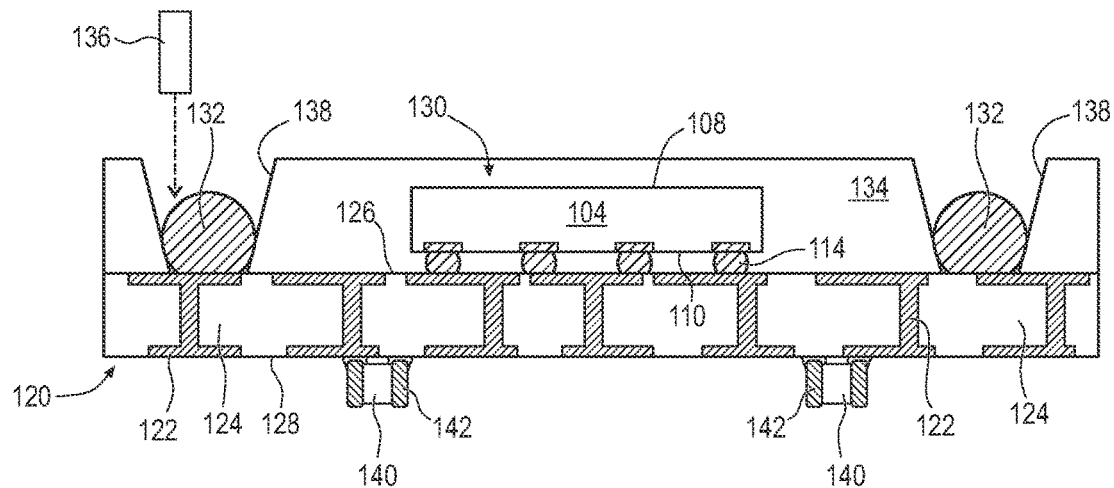

In FIG. 2e, a portion of encapsulant 134 is removed by direct laser ablation (LDA) using laser 136 to form opening 138 and expose bumps 132. The portion of encapsulant 134 can also be removed by etching or drilling. In particular, encapsulant 134 covers the back surface of electronic component 130. Electrical components 140, such as discrete electrical devices, can be mounted to surface 128 of interconnect substrate 120 with terminals 142 making electrical and mechanical contact with conductive layer 122.

Figure 2F:
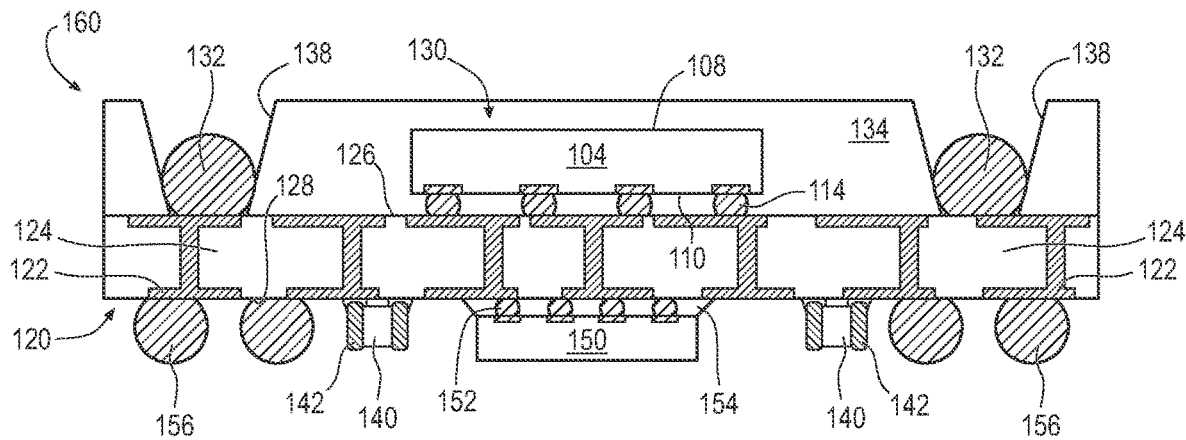

In FIG. 2f, electrical component 150 is mounted to surface 128 of interconnect substrate 120 and electrically and mechanically connected to conductive layer 122 with bumps 152, similar to electrical component 130 in FIGS. 2b-2c. Electrical component 150 is mounted to surface 128 for heat dissipation. An underfill material 154, such as epoxy resin, is deposited under electrical component 150. Underfill material 154 is cured. Electrical component 150 can be made similar to semiconductor die 104 from FIG. 1c, possibly with a different form and function. In one embodiment, electrical component 150 is an RF signal processing component. Alternatively, electrical component 150 can be a semiconductor package, surface mount device, discrete electrical device, discrete transistor, diode, or IPD. Semiconductor package 160 in FIG. 2f constitutes a package-on-package (PoP) with multiple electrical components and interconnect substrate.

An electrically conductive bump material is deposited over conductive layer 122 on surface 128 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 156. In one embodiment, bump 156 is formed over a UBM having a wetting layer, barrier layer, and adhesive layer.

Bump 156 can also be compression bonded or thermocompression bonded to conductive layer 122. Bump 156 represents one type of interconnect structure that can be formed over conductive layer 122. The interconnect structure can also use bond wires, conductive paste, stud bump, micro bump, or other electrical interconnect.

Figure 3A:
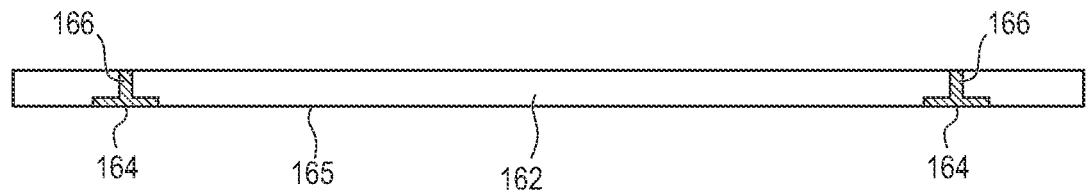
FIGS. 3a-3f illustrate a process of forming an RF antenna interposer.

FIGS. 3a-3f illustrate a process of forming an RF antenna interposer or substrate. In FIG. 3a, insulating layer 162 is made with SiO2, Si3N4, SiON, Ta2O5, Al2O3, solder resist, polyimide, polymer, BCB, PBO, and other material having similar insulating and structural properties. Conductive layer 164 is formed over surface 165 of insulating layer 162. Conductive layer 164 can be one or more layers of Al, Cu, Sn, Ni, Au, Ag, or other suitable electrically conductive material. Conductive layer 164 provides horizontal electrical interconnect across insulating layer 162, including surface 165. A plurality of vias is formed through insulating layer 162 by etching, drilling, or LDA. The vias are filled with conductive material to form conductive vias 166 for vertical electrical interconnect through insulating layer 162 to conductive layer 164.

Figure 3B:
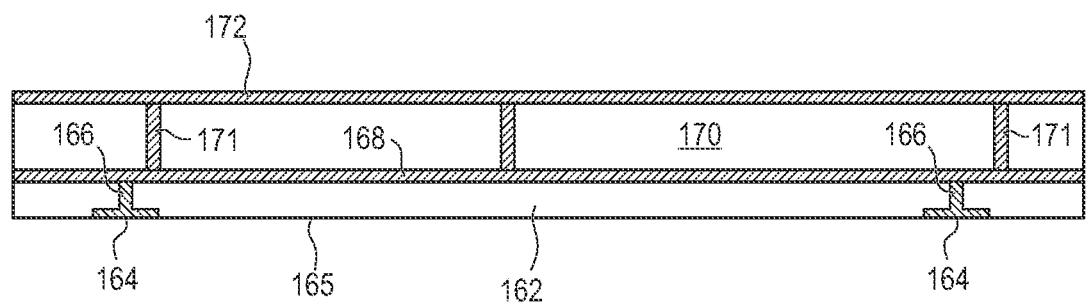

In FIG. 3b, conductive layer 168 is formed over insulating layer 162. Conductive layer 168 can be one or more layers of Al, Cu, Sn, Ni, Au, Ag, or other suitable electrically conductive material. Conductive layer 168 provides horizontal electrical interconnect across insulating layer 162 and electrically connects to conductive vias 166. An insulating layer 170 is formed over conductive layer 168. Insulating layer 170 is made with SiO2, Si3N4, SiON, Ta2O5, Al2O3, solder resist, polyimide, polymer, BCB, PBO, and other material having similar insulating and structural properties. A plurality of vias is formed through insulating layer 170 by etching, drilling, or LDA. The vias are filled with conductive material to form conductive vias 171 for vertical electrical interconnect through insulating layer 170 to conductive layer 168. Conductive layer 172 is formed over insulating layer 170. Conductive layer 172 can be one or more layers of Al, Cu, Sn, Ni, Au, Ag, or other suitable electrically conductive material. In one embodiment, conductive layer 172 provides a ground plane across insulating layer 170 and electrically connects to conductive vias 171.

Figure 3C:
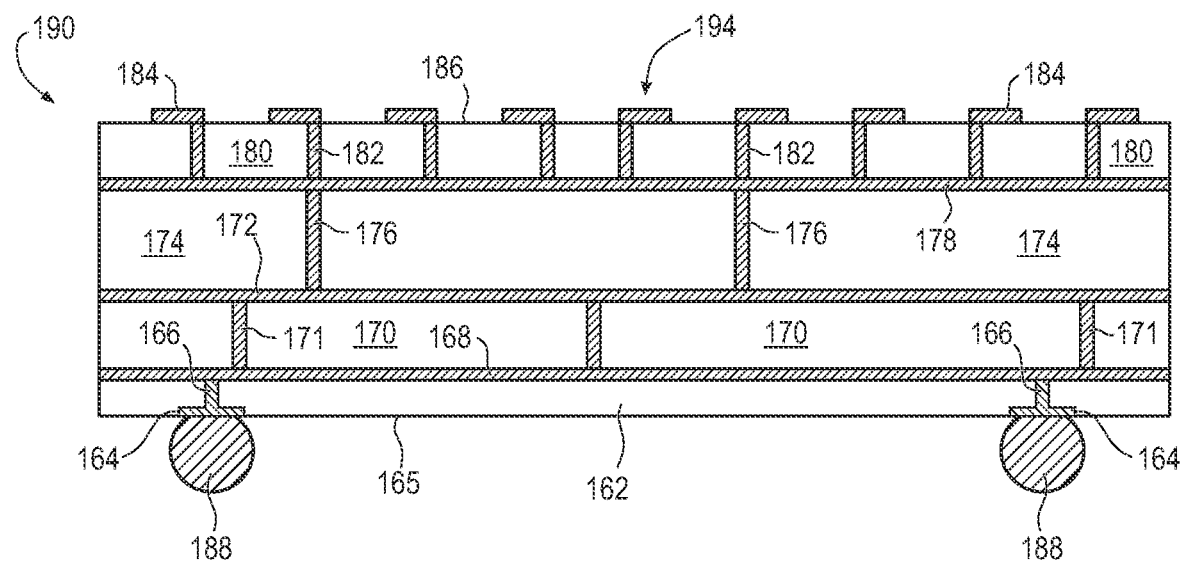

In FIG. 3c, insulating layer 174 is formed over conductive layer 172. Insulating layer 174 is made with SiO2, Si3N4, SiON, Ta2O5, Al2O3, solder resist, polyimide, polymer, BCB, PBO, and other material having similar insulating and structural properties. A plurality of vias is formed through insulating layer 174 by etching, drilling, or LDA. The vias are filled with conductive material to form conductive vias 176 for vertical electrical interconnect through insulating layer 174 to conductive layer 172. Conductive layer 178 is formed over insulating layer 174. Conductive layer 178 can be one or more layers of Al, Cu, Sn, Ni, Au, Ag, or other suitable electrically conductive material. Conductive layer 178 provides horizontal electrical interconnect across insulating layer 174 and electrically connects to conductive vias 176. Conductive layer 178 can be configured as an RF antenna, similar to RF antenna 194, embedded within RF antenna interposer 190. An insulating layer 180 is formed over conductive layer 178. Insulating layer 180 is made with SiO2, Si3N4, SiON, Ta2O5, Al2O3, solder resist, polyimide, polymer, BCB, PBO, and other material having similar insulating and structural properties. A plurality of vias is formed through insulating layer 180 by etching, drilling, or LDA. The vias are filled with conductive material to form conductive vias 182 for vertical electrical interconnect through insulating layer 180 to conductive layer 178. Conductive layer 184 is formed over surface 186 of insulating layer 180 and electrically connects to conductive vias 182. Conductive layer 184 can be one or more layers of Al, Cu, Sn, Ni, Au, Ag, or other suitable electrically conductive material. Conductive layer 184 operates as RF antenna 194 exposed from surface 186 of RF antenna interposer 190.

Figure 3D:
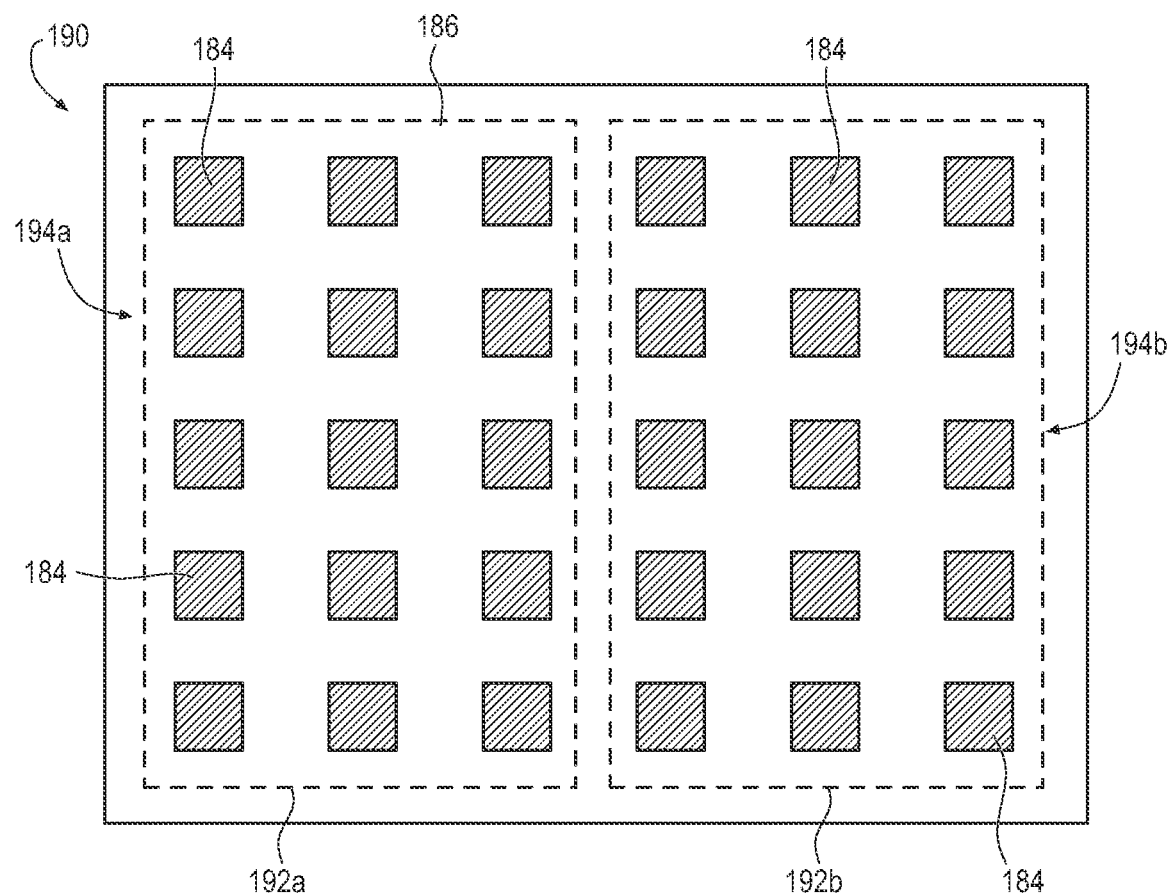

FIG. 3d is a top view of RF antenna interposer 190. Conductive layer 184 includes an array of islands of conductive material in the form of conductive layer 184 suitable to provide transmission and reception of RF signals, i.e., an RF antenna. In particular, the array of islands of conductive layer 184 are exposed from surface 186 and extend substantially across the surface of RF antenna interposer 190 to improve RF transmission and reception performance and quality. In one embodiment, the entire array of islands of conductive material can be used as a single antenna 194 for RF transmission and reception of electrical components 130, 140, or 150 in PoP 160. Alternatively, a first group of islands of conductive material 192a serves as a first antenna 194a electrically connected through conductive layers 164, 168, 172, 178 and conductive vias 166, 171, 176, 182 and bumps 188 to provide RF transmission and reception for a first electrical component 130, 140, 150 in PoP 160. A second group of islands of conductive material 192b serves as a second antenna 194b electrically connected through conductive layers 164, 168, 172, 178 and conductive vias 166, 171, 176, 182 and bumps 188 to provide RF transmission and reception for a second electrical component 130, 140, 150 in PoP 160. When configured as an RF antenna, conductive layer 178 can be electrically connected through conductive layers 164, 168, 172 and conductive vias 166, 171, 176 and bumps 188 to provide RF transmission and reception for a third electrical component 130, 140, 150 in PoP 160.

Figure 3E:
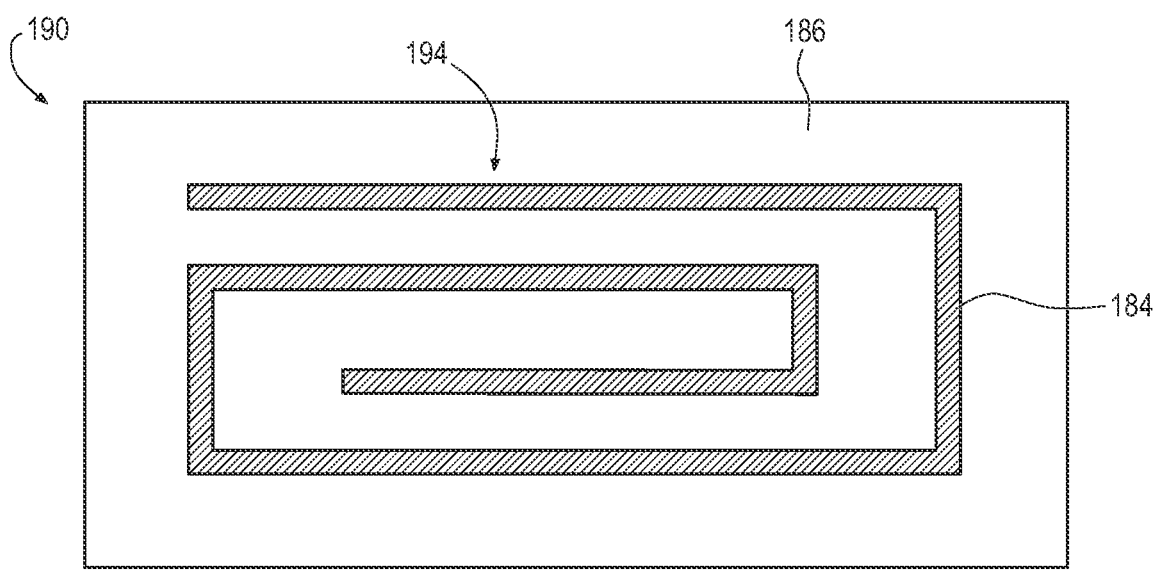

FIG. 3e is a top view of an alternate embodiment of RF antenna interposer 190. Conductive layer 184 includes a spiral shape of conductive material in the form of conductive layer 184 suitable to provide transmission and reception of RF signals. In particular, the spiral shape of conductive layer 184 is exposed from surface 186 and extends substantially across the surface of RF antenna interposer 190 to improve RF transmission and reception performance and quality. Conductive layer 184 serves as spiral-shaped RF antenna 194 electrically connected through conductive layers 164, 168, 172, 178 and conductive vias 166, 171, 176, 182 and bumps 188 to provide RF transmission and reception for a first electrical component 130, 140, 150 in PoP 160. When configured as an RF antenna, conductive layer 178 can be electrically connected through conductive layers 164, 168, 172 and conductive vias 166, 171, 176 and bumps 188 to provide RF transmission and reception for a second electrical component 130, 140, 150 in PoP 160.

Figure 3F:
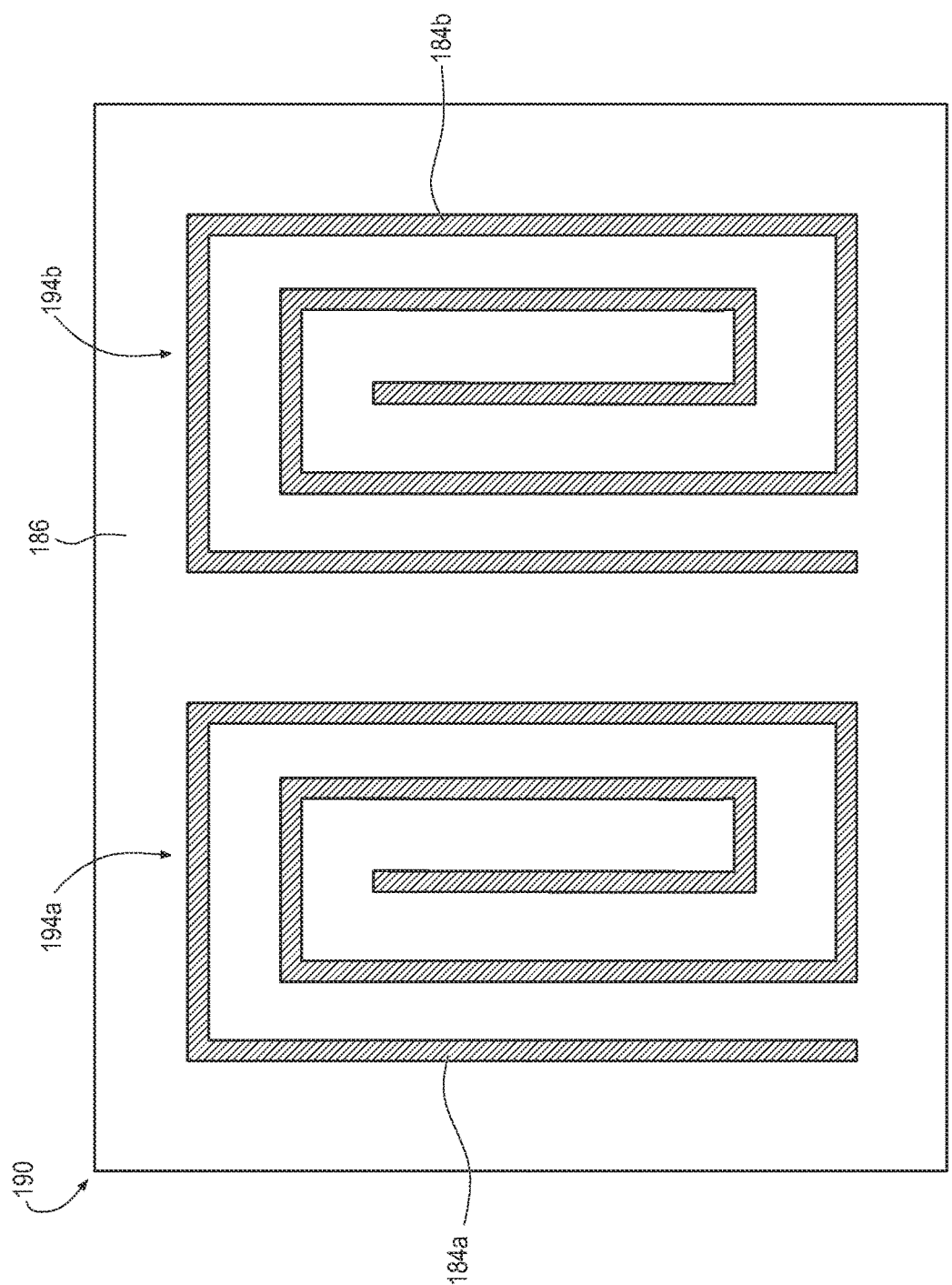

FIG. 3f is a top view of another embodiment of RF antenna interposer 190. Conductive layer 184 includes a plurality of spiral shapes of conductive material suitable to provide transmission and reception of RF signals. In particular, the spiral shapes of conductive layer 184 are exposed from surface 186 and extend substantially across the surface of RF antenna interposer 190 to improve RF transmission and reception performance and quality. In one embodiment, conductive layer 184a serves as a first spiral-shaped RF antenna 194a electrically connected through conductive layers 164, 168, 172, 178 and conductive vias 166, 171, 176, 182 and bumps 188 to provide RF transmission and reception for a first electrical component 130, 140, 150 in PoP 160. Conductive layer 184b serves as a second spiral-shaped RF antenna 194b electrically connected through conductive layers 164, 168, 172, 178 and conductive vias 166, 171, 176, 182 and bumps 188 to provide RF transmission and reception for a second electrical component 130, 140, 150 in PoP 160. When configured as an RF antenna, conductive layer 178 can be electrically connected through conductive layers 164, 168, 172 and conductive vias 166, 171, 176 and bumps 188 to provide RF transmission and reception for a third electrical component 130, 140, 150 in PoP 160.

Figure 4A:
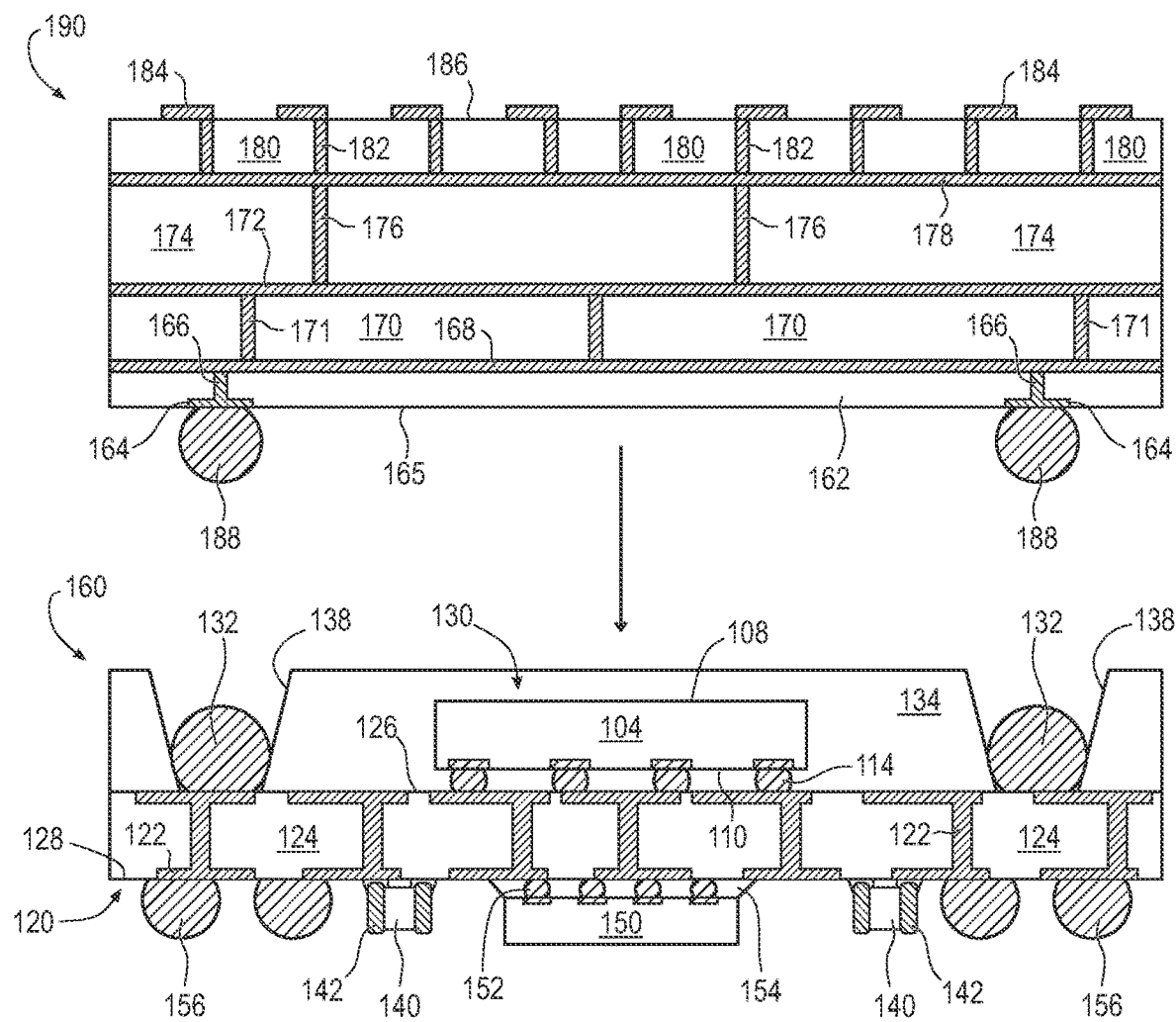
FIGS. 4a-4b illustrate integrating the RF antenna interposer and semiconductor package.
Figure 4B:
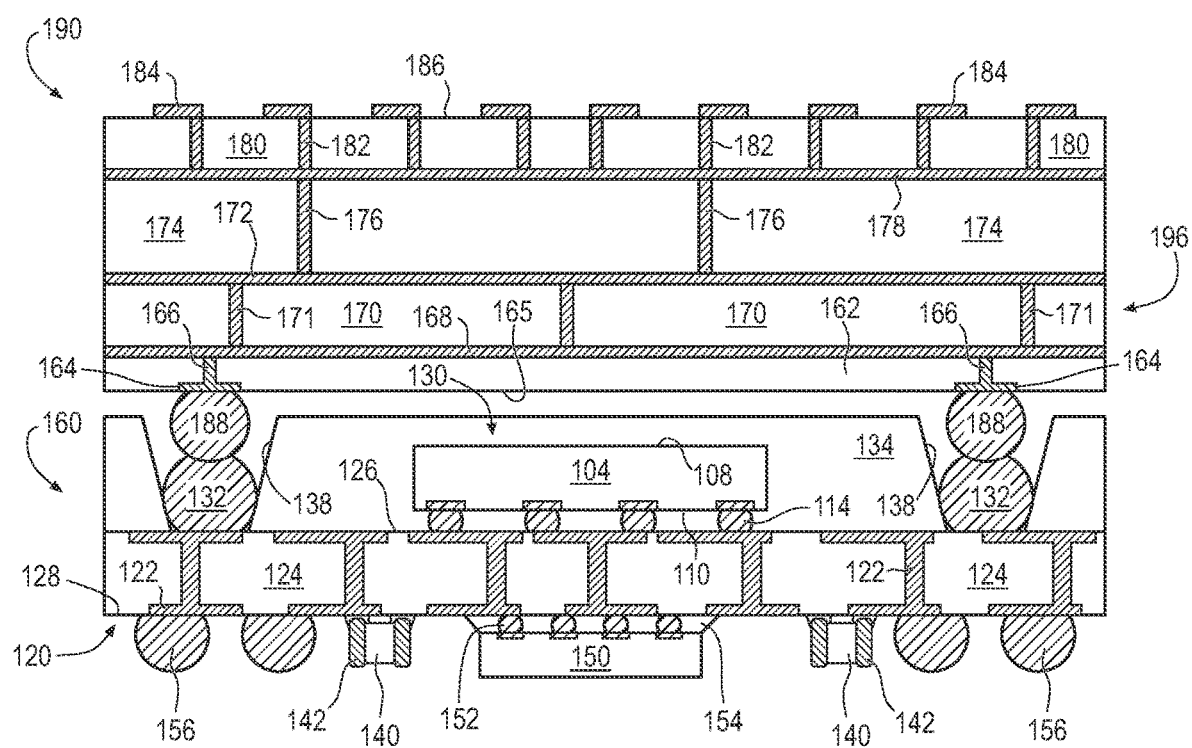

In FIG. 4a, RF antenna interposer 190 from FIGS. 3a-3f, is positioned over semiconductor package 160, from FIG. 2f, with bumps 188 aligned with bumps 132. RF antenna interposer 190 has substantially the same footprint and occupies substantially the same area as semiconductor package 160. RF antenna interposer 190 is lowered so that bumps 188 contact bumps 132 and the bumps are reflowed to electrically and mechanically join and integrate the RF antenna interposer to semiconductor package 160, as shown in FIG. 4b. The combination of semiconductor package 160 and RF antenna interposer 190 is designated as antenna on package (AoP) 196. As integrated into AoP 196, RF antenna interposer 190 provides the antenna function for RF electrical components 130, 140, and 150 in semiconductor package 160.

Figure 5A:
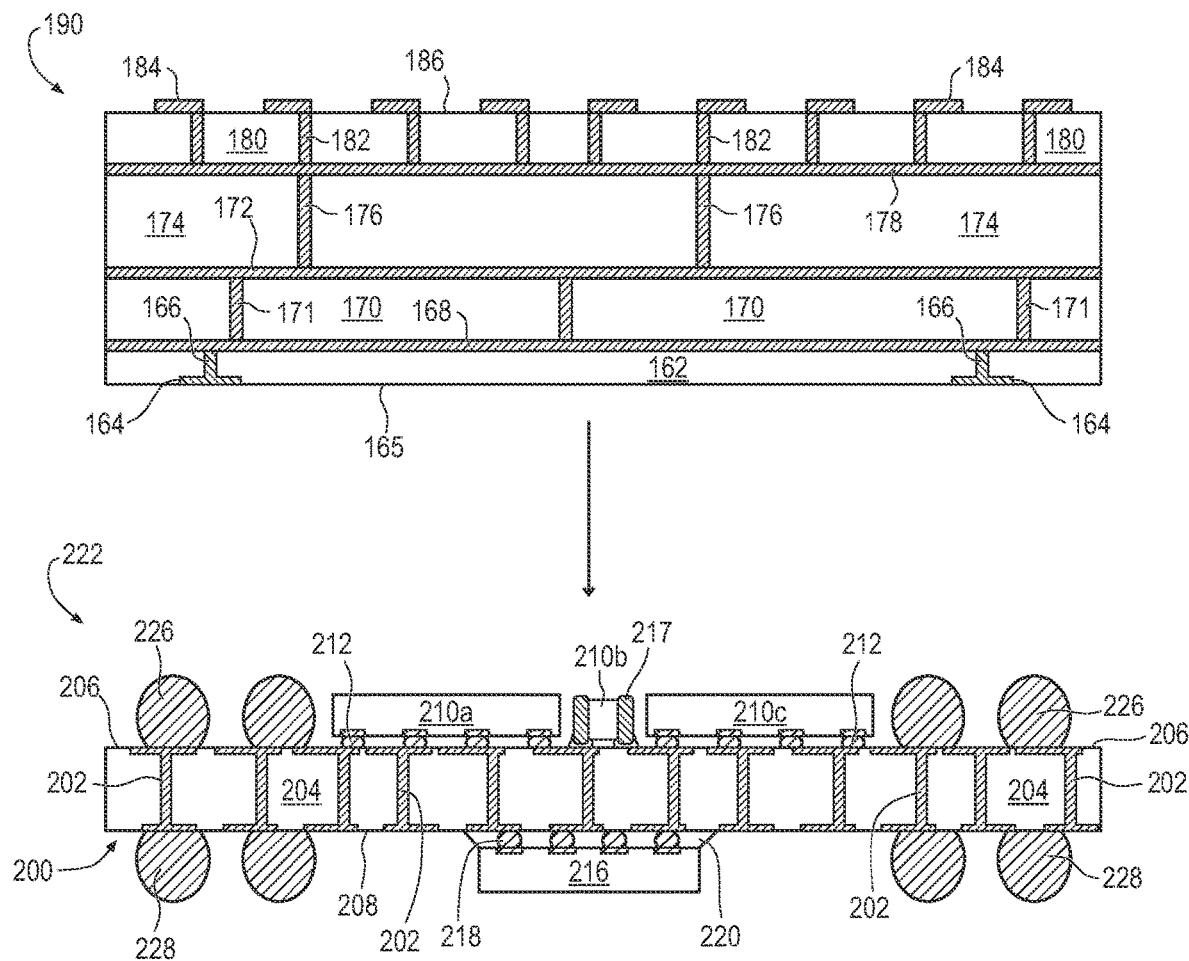
FIGS. 5a-5c illustrate integrating the RF antenna interposer with another semiconductor package.
Figure 5B:
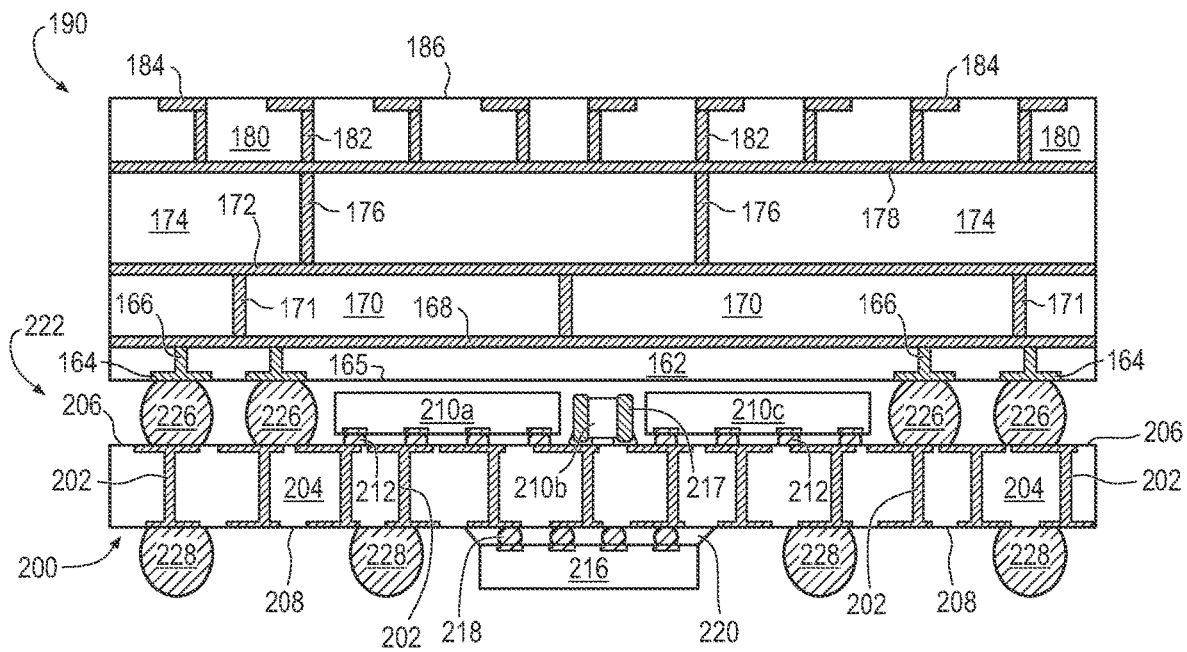
Figure 5C:
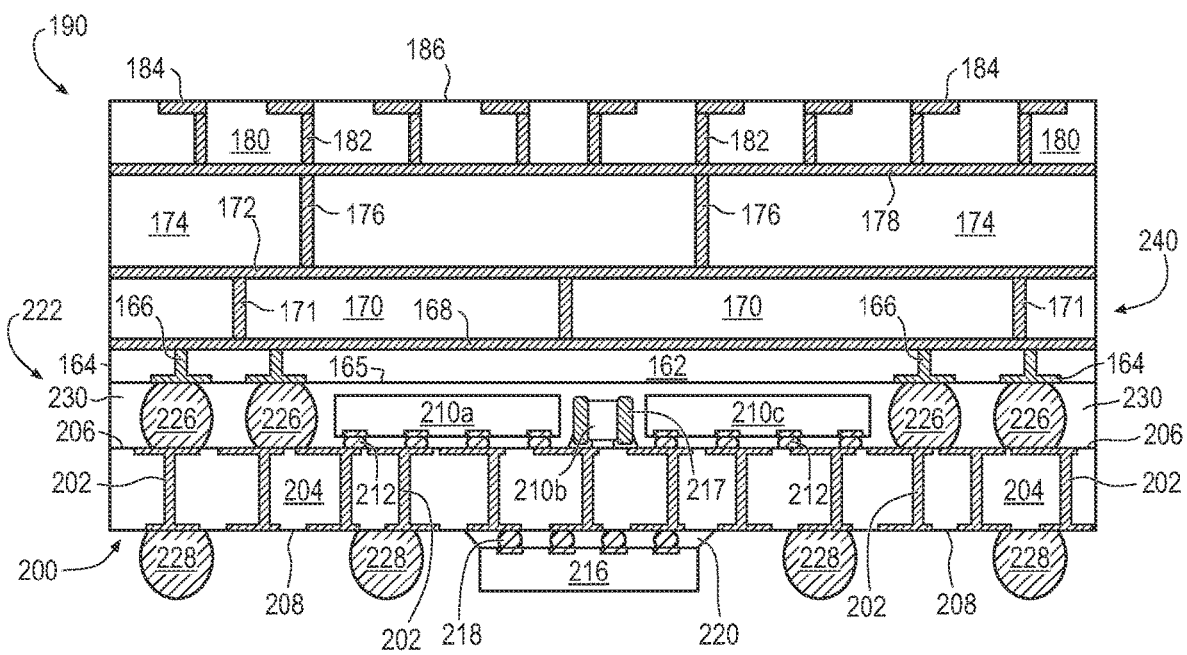

FIGS. 5a-5c illustrate another process of forming a semiconductor package with semiconductor die and interconnect substrate and integrating RF antenna interposer with the semiconductor package. FIG. 5a shows a cross-sectional view of interconnect substrate or PCB 200 including conductive layers 202 and insulating layer 204. Conductive layer 202 can be one or more layers of Al, Cu, Sn, Ni, Au, Ag, or other suitable electrically conductive material. Conductive layer 202 provides horizontal electrical interconnect across substrate 200 and vertical electrical interconnect between top surface 206 and bottom surface 208 of substrate 200. Portions of conductive layer 202 can be electrically common or electrically isolated depending on the design and function of the electrical components. Insulating layer 204 contains one or more layers of SiO2, Si3N4, SiON, Ta2O5, Al2O3, solder resist, polymer, polyimide, BCB, PBO, and other material having similar insulating and structural properties. Insulating layer 204 provides isolation between conductive layers 202.

Electrical components 210a-210c are positioned over substrate 120 using a pick and place operation, similar to FIG. 2b. For example, electrical component 210a or 210c can be semiconductor die 104 from FIG. 1c. Additional electrical component 210b, such as a discrete electrical device, can be mounted to surface 206 of interconnect substrate 200. In one embodiment, electrical component 210a-210c are RF signal processing components. Additional electrical components, such as other semiconductor die, semiconductor package, surface mount device, discrete electrical device, discrete transistor, diode, or IPD, can be mounted to interconnect substrate 200. Electrical components 210a-210c are mounted to surface 206 of interconnect substrate 200 with bumps 212 and terminals 217 making mechanical and electrical connection to conductive layer 202, similar to FIG. 2c.

Electrical component 216 is mounted to surface 208 of interconnect substrate 200 and electrically and mechanically connected to conductive layer 202 with bumps 218, similar to electrical component 150 in FIGS. 2b-2c. Electrical component 216 is mounted to surface 208 for heat dissipation. An underfill material 220, such as epoxy resin, is deposited under electrical component 216. Underfill material 220 is cured. Electrical component 216 can be made similar to semiconductor die 104 from FIG. 1c, possibly with a different form and function. In one embodiment, electrical component 216 is an RF signal processing component. Alternatively, electrical component 216 can be a semiconductor package, surface mount device, discrete electrical device, discrete transistor, diode, or IPD. Additional electrical components can be mounted to surface 208 of interconnect substrate 200.

An electrically conductive bump material is deposited over conductive layer 202 on surface 206 and surface 208 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 202 using a suitable attachment or bonding process. In one embodiment, the bump material is reflowed by heating the material above its melting point to form balls or bumps 226 and 228. In one embodiment, bumps 226 and 228 are formed over a UBM having a wetting layer, barrier layer, and adhesive layer. Bumps 226 and 228 can also be compression bonded or thermocompression bonded to conductive layer 202. Bumps 226 and 228 represents one type of interconnect structure that can be formed over conductive layer 202. The interconnect structure can also use bond wires, conductive paste, stud bump, micro bump, or other electrical interconnect.

Semiconductor package 222 constitutes a PoP with multiple electrical components and interconnect substrate. RF antenna interposer 190 from FIGS. 3a-3f is positioned over PoP 222. FIG. 5b shows RF antenna interposer 190 mounted to PoP 222 with bumps 226 electrically and mechanically connected to conductive layer 164. RF antenna interposer 190 has substantially the same footprint and occupies substantially the same area as PoP 222.

In FIG. 5c, an encapsulant or molding compound 230 is deposited over electrical component 210a-210c, bumps 226, and surface 206 of interconnect substrate 200 using a paste printing, compressive molding, transfer molding, liquid encapsulant molding, vacuum lamination, spin coating, or other suitable applicator. Encapsulant 230 can be polymer composite material, such as epoxy resin with filler, epoxy acrylate with filler, or polymer with proper filler. Encapsulant 230 is non-conductive, provides structural support, and environmentally protects the semiconductor device from external elements and contaminants.

The combination of PoP 222 and RF antenna interposer 190 is designated as AoP 240. As integrated into AoP 240, RF antenna interposer 190 provides the antenna function for RF electrical components 210a-210c and 216 in PoP 222.

Figure 6:
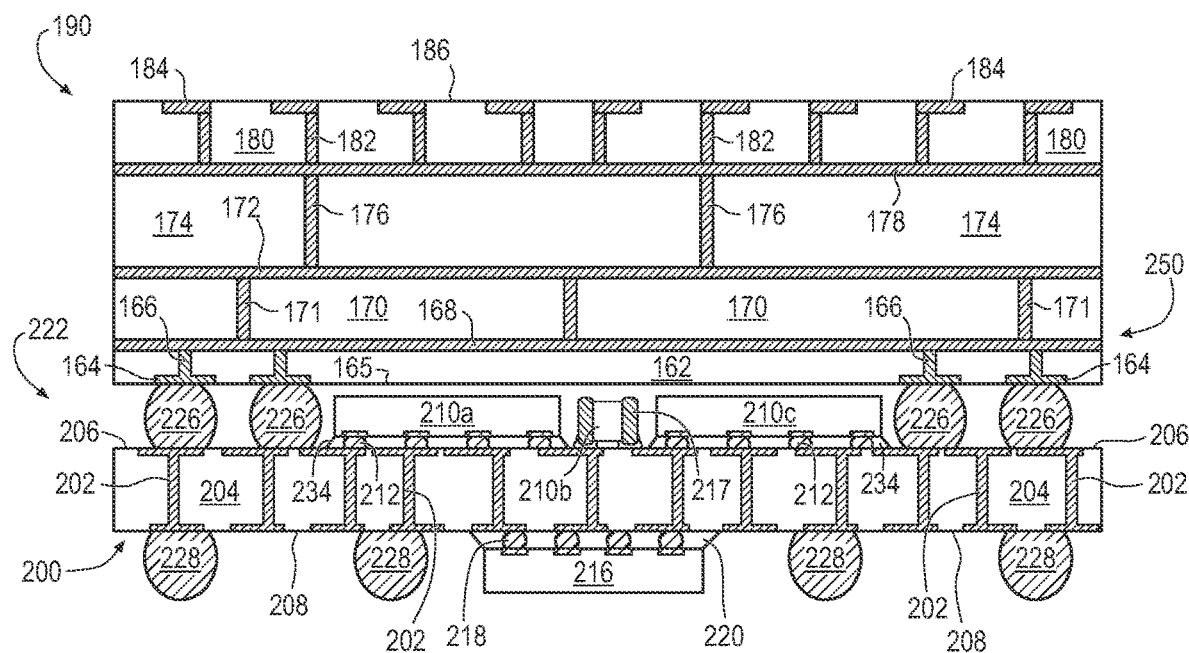
FIG. 6 illustrates the integrated RF antenna interposer and semiconductor package without encapsulation.

FIG. 6 illustrates an embodiment without an encapsulant between RF antenna interposer 190 and PoP 222. In this case, underfill material 234 is deposited under and around electrical components 210a-210c. Underfill material 234 is cured. In each of FIGS. 5c and 6, conductive layer 184 in RF antenna interposer 190 provides transmission and reception of RF signals for electrical components in PoP 222. In particular, at least a portion of conductive layer 184 is exposed from surface 186 to serve as RF antenna 194 and extends substantially across the surface of RF antenna interposer 190 to improve RF transmission and reception performance and quality. RF antenna interposer 190 has substantially the same footprint and occupies substantially the same area as PoP 222. The exposed portion of conductive layer 184, serving as RF antenna 194, can be electrically connected through conductive layers 164, 168, 172, 178 and conductive vias 166, 171, 176, 182 and bumps 188 to provide RF transmission and reception for a first electrical component 210a-210c, 216 in PoP 222.

The combination of PoP 222 without encapsulation and RF antenna interposer 190 is designated as AoP 250. As integrated into AoP 250, RF antenna interposer 190 provides the antenna function for RF electrical components 210a-210c and 216 in PoP 222.

Figure 7:
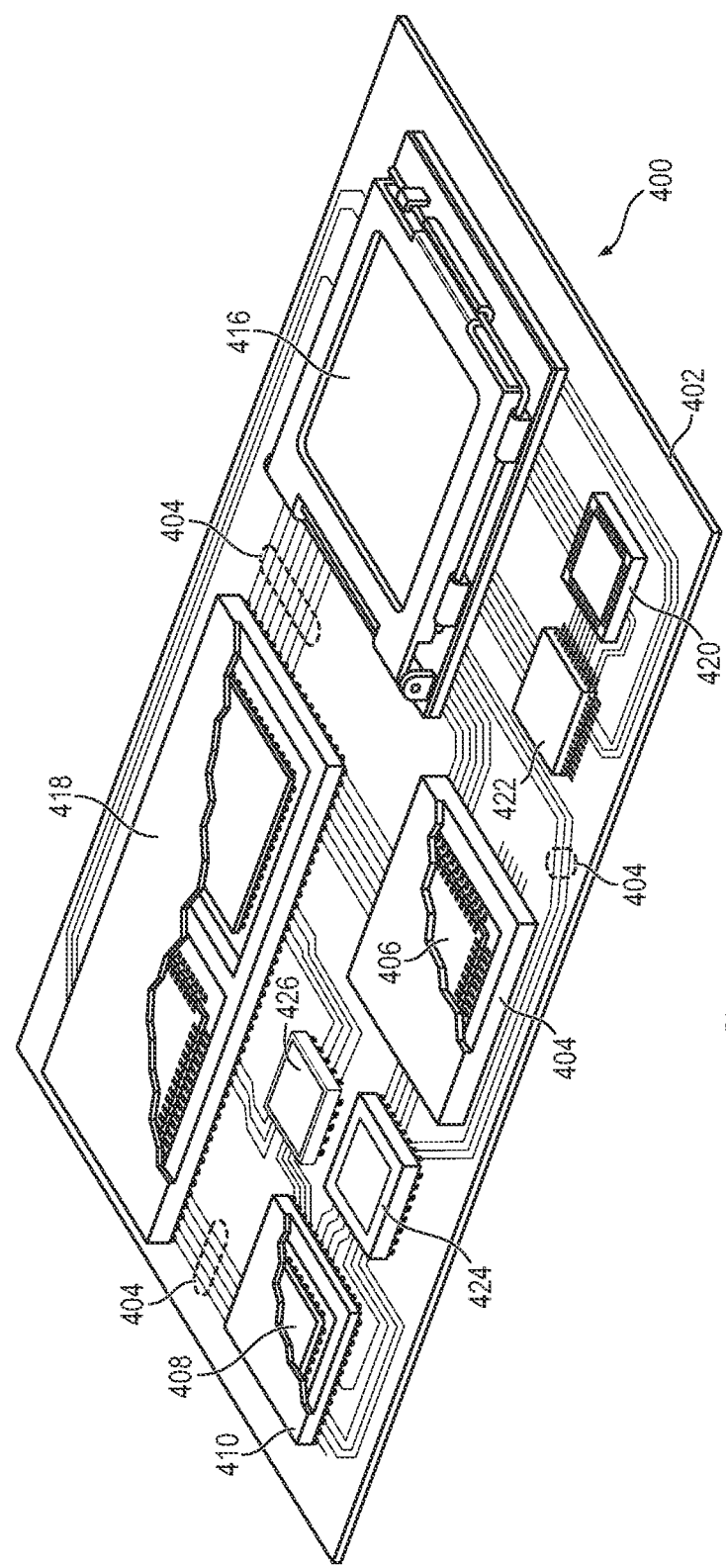
FIG. 7 illustrates a printed circuit board (PCB) with different types of packages mounted to a surface of the PCB.

FIG. 7 illustrates electronic device 400 having a chip carrier substrate or PCB 402 with a plurality of semiconductor packages mounted on a surface of PCB 402, including semiconductor packages 196, 240, and 250. Electronic device 400 can have one type of semiconductor package, or multiple types of semiconductor packages, depending on the application.

Electronic device 400 can be a stand-alone system that uses the semiconductor packages to perform one or more electrical functions. Alternatively, electronic device 400 can be a subcomponent of a larger system. For example, electronic device 400 can be part of a tablet, cellular phone, digital camera, communication system, or other electronic device. Alternatively, electronic device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 7, PCB 402 provides a general substrate for structural support and electrical interconnect of the semiconductor packages mounted on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown mounted on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electronic components, can be connected to PCB 402. In some embodiments, electronic device 400 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   disposing a first electrical component over a first surface of the substrate; and
   disposing an antenna interposer over the substrate with the first electrical component connected to a first antenna disposed on a surface of the antenna interposer, wherein the first antenna extends substantially across an entire surface area of the antenna interposer which is substantially the same as an area of the substrate.

2. The method of claim 1, wherein the first antenna disposed on the surface of the antenna interposer includes a plurality of islands of conductive material.

3. The method of claim 1, wherein the first antenna disposed on the surface of the antenna interposer includes a spiral shape of conductive material.

4. The method of claim 1, further including a second antenna disposed on the surface of the antenna interposer connected to a second electrical component disposed over the substrate.

5. The method of claim 1, further including disposing a second electrical component over a second surface of the substrate opposite the first surface of the substrate.

6. A method of making a semiconductor device, comprising:
   providing a substrate; and
   disposing an antenna interposer over the substrate, wherein the antenna interposer includes a first antenna disposed on a surface of the antenna interposer and extending substantially across a surface area of the antenna interposer where the surface area of the antenna interposer is substantially the same as an area of the substrate.

7. The method of claim 6, further including disposing a first electrical component over a first surface of the substrate.

8. The method of claim 7, further including disposing a second electrical component over a second surface of the substrate opposite the first surface of the substrate.

9. The method of claim 6, wherein the first antenna disposed on the surface of the antenna interposer includes a plurality of islands of conductive material.

10. The method of claim 6, wherein the first antenna disposed on the surface of the antenna interposer includes a spiral shape of conductive material.

11. The method of claim 1, further including disposing a second antenna on the surface of the antenna interposer.

12. A semiconductor device, comprising:
   a substrate;
   a first electrical component disposed over a first surface of the substrate; and
   an antenna interposer disposed over the substrate with the first electrical component connected to a first antenna disposed on a surface of the antenna interposer, wherein the first antenna extends substantially across a surface area of the antenna interposer where the surface area of the antenna interposer is substantially the same as an area of the substrate.

13. The semiconductor device of claim 12, wherein the first antenna disposed on the surface of the antenna interposer includes a plurality of islands of conductive material.

14. The semiconductor device of claim 12, wherein the first antenna disposed on the surface of the antenna interposer includes a spiral shape of conductive material.

15. The semiconductor device of claim 12, further including a second antenna disposed on the surface of the antenna interposer connected to a second electrical component disposed over the substrate.

16. The semiconductor device of claim 12, further including disposing a second electrical component over a second surface of the substrate opposite the first surface of the substrate.

17. A semiconductor device, comprising:
a substrate; and
an antenna interposer disposed over the substrate, wherein the antenna interposer includes a first antenna disposed on a surface of the antenna interposer and extending substantially across a surface area of the antenna interposer and the surface area of the antenna interposer is substantially the same as an area of the substrate.

18. The semiconductor device of claim 17, further including a first electrical component disposed over a first surface of the substrate.

19. The semiconductor device of claim 18, further including a second electrical component disposed over a second surface of the substrate opposite the first surface of the substrate.

20. The semiconductor device of claim 17, wherein the first antenna disposed on the surface of the antenna interposer includes a plurality of islands of conductive material or a spiral shape of conductive material.

21. The semiconductor device of claim 17, further including a second antenna disposed on the surface of the antenna interposer.

* * * * *